(12) United States Patent
Kim et al.

(10) Patent No.: US 9,159,729 B2
(45) Date of Patent: Oct. 13, 2015

(54) CAPACITOR OF SEMICONDUCTOR DEVICE AND METHOD OF FABRICATING THE SAME

(71) Applicant: Samsung Electronics Co., Ltd., Suwon-Si, Gyeonggi-Do (KR)

(72) Inventors: Hyongsoo Kim, Hwaseong-si (KR); Jin-Su Lee, Hwaseong-si (KR); Hojun Kwon, Seoul (KR); Dongkyun Park, Suwon-si (KR); Jiseung Lee, Seoul (KR); Young-Seok Choi, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 55 days.

(21) Appl. No.: 14/028,976

(22) Filed: Sep. 17, 2013

(65) Prior Publication Data

US 2014/0120683 A1  May 1, 2014

(30) Foreign Application Priority Data

Nov. 1, 2012  (KR) .......................... 10-2012-0122989

(51) Int. Cl.
*H01L 27/108* (2006.01)
*H01L 49/02* (2006.01)

(52) U.S. Cl.
CPC .... *H01L 27/10817* (2013.01); *H01L 27/10852* (2013.01); *H01L 28/40* (2013.01); *H01L 28/91* (2013.01)

(58) Field of Classification Search
CPC .............. H01L 28/40; H01L 27/10852; H01L 27/10817
See application file for complete search history.

(56) References Cited

U.S. PATENT DOCUMENTS

| 6,465,352 B1 | 10/2002 | Aoki |
| 7,202,127 B2 | 4/2007 | Busch et al. |
| 7,220,641 B2 | 5/2007 | Nam |
| 7,364,967 B2 | 4/2008 | Kim et al. |
| 7,919,863 B2 | 4/2011 | Benson |

FOREIGN PATENT DOCUMENTS

| KR | 20050062679 A | 6/2005 |
| KR | 20050074761 A | 7/2005 |
| KR | 20060072516 A | 6/2006 |
| KR | 20060094295 A | 8/2006 |
| KR | 100636931 B1 | 10/2006 |
| KR | 100838370 B1 | 6/2008 |
| KR | 20090032880 A | 4/2009 |

*Primary Examiner* — Amar Movva
(74) *Attorney, Agent, or Firm* — Harness, Dickey & Pierce, P.L.C.

(57) ABSTRACT

Capacitor of a semiconductor device, and a method of fabricating the same, include sequentially forming a mold structure and a polysilicon pattern over a semiconductor substrate, patterning the mold structure using the polysilicon pattern as an etch mask to form lower electrode holes penetrating the mold structure, forming a protection layer covering a surface of the polysilicon pattern, forming lower electrodes in the lower electrode holes provided with the protection layer, removing the polysilicon pattern and the protection layer to expose upper sidewalls of the lower electrodes, removing the mold structure to expose lower sidewalls of the lower electrodes, and sequentially forming a dielectric and an upper electrode covering the lower electrodes.

16 Claims, 15 Drawing Sheets

CAPACITOR OF SEMICONDUCTOR DEVICE AND METHOD OF FABRICATING THE SAME

CROSS-REFERENCE TO RELATED APPLICATIONS

This U.S. non-provisional patent application claims the benefit of priority under 35 U.S.C. §119 to Korean Patent Application No. 10-2012-0122989, filed on Nov. 1, 2012, in the Korean Intellectual Property Office, the entire contents of which are herein incorporated by reference.

BACKGROUND

1. Field

Example embodiments of the inventive concepts relate to a semiconductor device and/or a method of fabricating the same, and in particular, to a capacitor of a semiconductor device and/or a method of fabricating the same.

2. Description of Related Art

As semiconductor devices become more highly integrated, a capacitor having sufficient capacitance in a limited area is required. The capacitance of a capacitor is proportional to a surface area of an electrode and a dielectric constant of dielectric film, and is inversely proportional to an equivalent oxide thickness of the dielectric film. In methods for increasing the capacitance of capacitor in a limited area, a surface area of electrode may be increased by forming a capacitor of a three dimensional structure; an equivalent oxide thickness of dielectric film may be reduced; and a dielectric film having a high dielectric constant may be used. In methods that increase the surface area of electrode, a height of lower electrode (or a storage electrode) may be increased; an effective surface area of lower electrode using a hemi-spherical grain (HSG) may be enlarged; and an inside area and an outside area of cylinder using one cylinder storage (OCS) electrode may be used.

SUMMARY

Some example embodiments of the inventive concepts provide a method of fabricating a semiconductor device, in which a lower electrode of a capacitor is provided to have an increased surface area.

Other example embodiments of the inventive concepts provide a semiconductor device, in which a capacitor is provided to have an improved reliability.

According to example embodiments of the inventive concepts, a method of fabricating a capacitor of a semiconductor device includes sequentially forming a mold structure and a polysilicon pattern over a semiconductor substrate, patterning the mold structure using the polysilicon pattern as an etch mask to form lower electrode holes penetrating (or, alternatively, extending through) the mold structure, forming a protection layer covering a surface of the polysilicon pattern, forming lower electrodes in the lower electrode holes provided with the protection layer, removing the polysilicon pattern and the protection layer to expose upper sidewalls of the lower electrodes, removing the mold structure to expose lower sidewalls of the lower electrodes, and sequentially forming a dielectric and an upper electrode covering the lower electrodes.

In example embodiments, the forming a protection layer may include performing a deposition process.

In example embodiments, the forming a protection layer may include treating a surface of the polysilicon pattern with plasma generated from an oxygen gas or a nitrogen gas.

In example embodiments, the forming a protection layer may include forming a silicon oxide layer or a silicon nitride layer.

In example embodiments, the removing the polysilicon pattern and the protection layer may include partially removing an upper portion of the mold structure so as to reduce a thickness of the mold structure.

In example embodiments, the forming a mold structure may include sequentially stacking a first mold layer, a first supporting layer, a second mold layer, and a second supporting layer on the semiconductor substrate.

In example embodiments, the removing the mold structure may include patterning the second supporting layer to form an opening exposing an upper portion of the second mold layer, removing the second mold layer exposed through the opening so as to expose a portion of the first supporting layer, patterning the exposed portion of the first supporting layer to expose the first mold layer, and removing the first mold layer.

In example embodiments, the patterning of the exposed portion of the first supporting layer and the second supporting layer may include forming first and second supporting patterns, respectively. The first and second supporting patterns may each partially contact side surfaces of the lower electrodes.

In example embodiments, the forming a mold structure may include forming the first and second supporting layers of materials having an etch selectivity with respect to materials used to form the first and second mold layers in the removal of the first and second mold layers.

In example embodiments, the forming lower electrodes may include depositing a conductive layer conformally covering inner surfaces of the lower electrode holes.

According to other example embodiments of the inventive concepts, a capacitor of a semiconductor device includes a lower electrode over a semiconductor substrate, a dielectric covering a surface of the lower electrode, an upper electrode covering the dielectric, and a first supporting pattern supporting a side surface of the lower electrode. The lower electrode may include a lower portion below the first supporting pattern, and an upper portion over the first supporting pattern, and the upper portion of the lower electrode has a width smaller than a width of the lower portion of the lower electrode.

In example embodiments, the lower electrode may have a hollow cylindrical structure including a bottom portion and sidewall portions integral with the bottom portion, the sidewall portions extend away from the bottom portion, and a diameter of the lower electrode may be smaller near the upper portion of the lower electrode than near the lower portion of the lower electrode.

In example embodiments, the method may further include a second supporting pattern below the first supporting pattern. The second supporting pattern supporting the side surface of the lower electrode.

In example embodiments, the first supporting pattern may be thicker than the second supporting pattern.

According to yet other example embodiments of the inventive concepts, a method of fabricating a capacitor includes providing mold structure patterns over a semiconductor substrate. The mold structure patterns are spaced apart from each other. The providing mold structure patterns includes forming mold patterns on the substrate, the mold pattern having a polysilicon pattern over an uppermost layer, and forming a polysilicon mask shield covering the polysilicon pattern. The method further includes forming lower electrodes each between adjacent mold structure patterns, the lower electrodes each contacting sidewalls of the polysilicon mask shield, exposing sidewalls of the lower electrodes by partially removing the mold structure patterns, and sequentially forming a dielectric and an upper electrode covering the lower electrodes.

The exposing sidewalls of the lower electrodes may include, sequentially, exposing an upper portion of the sidewalls of the lower electrodes by removing the polysilicon mask shield and the polysilicon pattern using a dry etchant, and exposing a lower portion of the sidewalls of the lower electrodes by partially removing the mold patterns using a wet etchant.

The forming mold patterns may comprise sequentially forming an etch stop layer, a first mold layer, a first supporting layer, a second mold layer, a second supporting layer, and the polysilicon pattern over the semiconductor substrate, and patterning the second supporting layer, the second mold layer, the first supporting layer and the first mold layer to form a second supporting pattern, a second mold pattern, a first supporting pattern and a first mold pattern, respectively. The first and second supporting patterns may remain in contact with sidewalls of the lower electrodes, after partially removing the mold structure patterns.

The sequentially forming a dielectric and an upper electrode covering the lower electrodes may include forming the upper electrode covering sidewalls of the lower electrodes between the first and second supporting patterns. The upper electrode between the first and second supporting patterns may be hollow.

The forming a polysilicon mask shield may include conformally forming a nitride layer or an oxide layer covering exposed surfaces of the polysilicon pattern by performing a plasma process or a deposition process.

The forming a polysilicon mask shield covering the polysilicon pattern may include forming the polysilicon mask shield having sidewalls extending beyond sidewalls of the polysilicon pattern so as to reduce a space between the polysilicon pattern over adjacent mold patterns.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
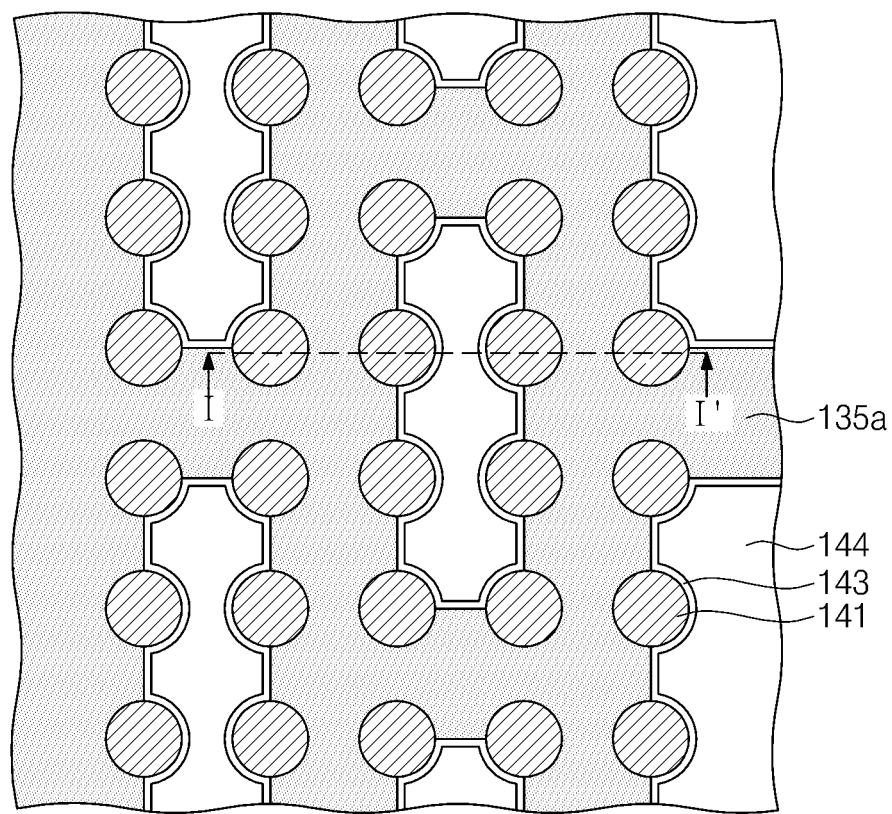
FIG. 1 is a plan view illustrating a capacitor of a semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments of the inventive concepts relate to a semiconductor device and/or a method of fabricating the same, and in particular, to a capacitor of a semiconductor device and/or a method of fabricating the same.

Figure 2:
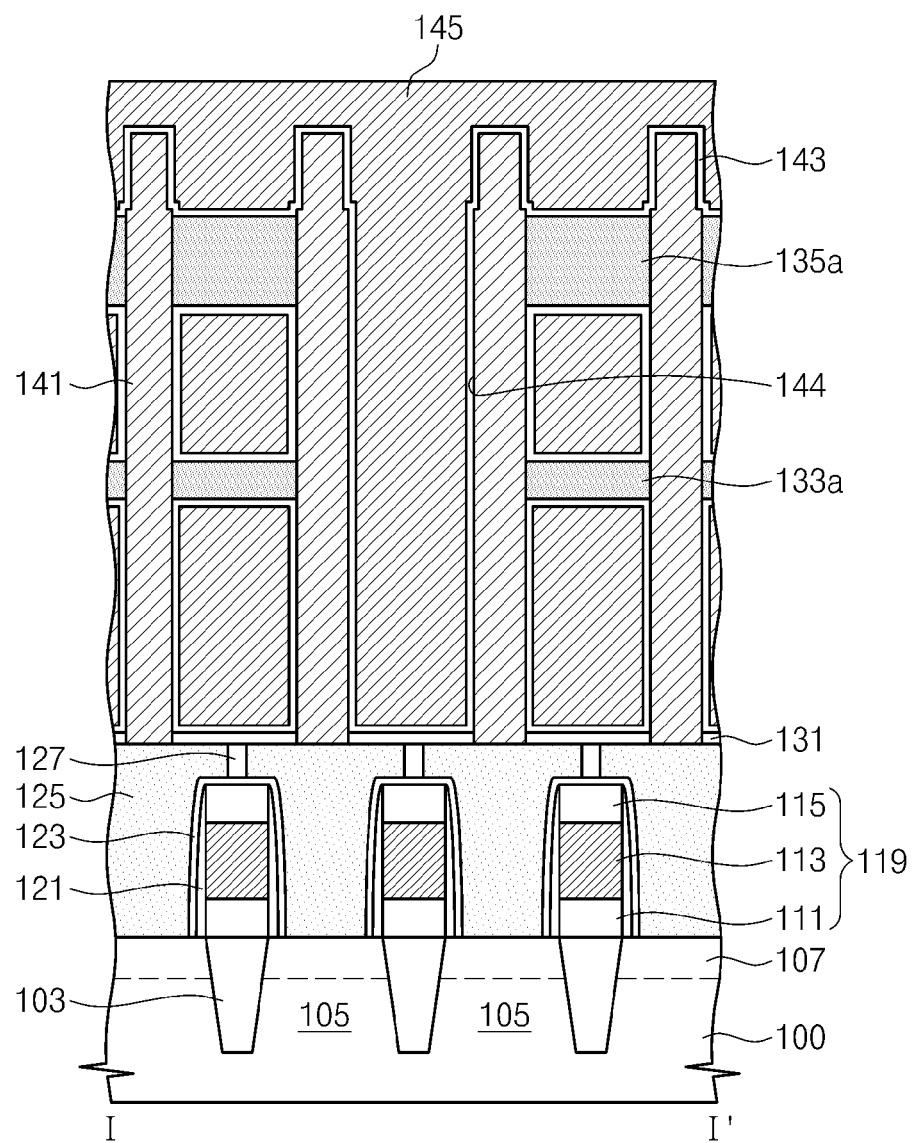
FIG. 2 is a sectional view taken along a line I-I' of FIG. 1 to illustrate a capacitor of a semiconductor device according to example embodiments of the inventive concepts.

FIG. 1 is a plan view illustrating a capacitor of a semiconductor device according to example embodiments of the inventive concepts. FIG. 2 is a sectional view taken along a line I-I' of FIG. 1 to illustrate a capacitor of a semiconductor device according to example embodiments of the inventive concepts.

Referring to FIGS. 1 and 2, a semiconductor substrate 100 may include active regions 105 defined by device isolation layers 103. For example, the device isolation layers 103 may be formed on the semiconductor substrate 100 to define the active regions 105. The semiconductor substrate 100 may be for example, a bulk silicon wafer, a silicon-on-insulator (SOI) wafer, a germanium wafer, a germanium-on-insulator wafer, a silicon-germanium substrate, or a substrate with an epitaxial layer obtained by a selective epitaxial growth (SEG) process. The device isolation layers 103 may be formed of an insulating material.

Word lines 119 may be provided on the semiconductor substrate 100. The word lines 119 may be arranged spaced apart from each other on the semiconductor substrate 100. Each of the word lines 119 may include a gate insulating layer 111, a gate electrode 113, and a gate capping layer 115 sequentially stacked on the semiconductor substrate 100. The gate insulating layer 111 may be formed of an insulating material (e.g., a thermally grown oxide layer). The gate electrode 113 may be formed of a conductive material (e.g., polysilicon, metal materials, or metal silicide materials). The gate capping layer 115 may be formed of an insulating material.

Bit lines (not shown) may be formed on the word lines 119 to cross the word lines 119. The semiconductor substrate 100 may include source/drain electrodes 107 provided in each of the active regions 105 at both sides of each word line 119. The gate electrode 113 and the source/drain electrodes 107 may constitute transistors integrated on the semiconductor substrate 100.

Spacers 121 may be disposed on sidewalls of the word lines 119, respectively. The spacer 121 may include a silicon nitride layer. A capping layer 123 may be formed on the word lines 119 to cover conformally the spacers 121 and the word lines 119.

An interlayered insulating layer 125 may be formed on the semiconductor substrate 100 to cover the word lines 119 and the capping layer 123. The interlayered insulating layer 125 may be formed of at least one insulating layer. In example embodiments, the interlayered insulating layer 125 may include an insulating material having a good gap-fill property.

Contact plugs 127 may be formed to penetrate the interlayered insulating layer 125. The contact plugs 127 may be electrically connected to the source/drain electrodes 107.

Lower electrodes 141 may be formed on the contact plugs 127. Each of the lower electrodes 141 may be shaped like a pillar with a high aspect ratio. A first supporting pattern 133a and a second supporting pattern 135a may be provided on side surfaces of the lower electrodes 141. The first supporting pattern 133a may be provided at a level lower than the second supporting pattern 135a. Each of the lower electrodes 141 may include a lower portion and an upper portion, which are provided below and over the second supporting pattern 135a, respectively. The upper portion of the lower electrode 141 may have a width smaller than that of the lower portion of the lower electrode 141. In example embodiments, the upper portion of the lower electrodes 141 may have an upward protruding structure.

The first supporting pattern 133a may have a thickness smaller than that of the second supporting pattern 135a.

The lower electrodes 141 may include at least one of metal materials, metal nitrides, or metal silicides. For example, the lower electrodes 141 may be formed of refractory metals, such as cobalt, titanium, nickel, tungsten, and molybdenum. In other embodiments, the lower electrodes 141 may be formed of a metal nitride layer (e.g., of titanium nitride (TiN), titanium silicon nitride (TiSiN), titanium aluminum nitride (TiAlN), tantalum aluminum nitride (TaAlN), and tungsten nitride (WN)). In still other example embodiments, the lower electrodes 141 may be formed of at least one noble metal selected from the group consisting of platinum (Pt), ruthenium (Ru) and iridium (Ir). In even other example embodiments, the lower electrodes 141 may be formed of at least one of conductive oxides of precious metals (e.g., PtO, $RuO_2$, or $IrO_2$) or conductive oxides (e.g., SRO ($SrRuO_3$), BSRO ((Ba,Sr)$RuO_3$), CRO ($CaRuO_3$), or LSCo).

An etch stop layer 131 may be provided on the interlayered insulating layer 125. The lower electrodes 141 may be electrically connected to the contact plugs 127 through the etch stop layer 131. The first supporting pattern 133a may be disposed spaced apart from the etch stop layer 131. The etch stop layer 131 may be formed of a silicon nitride layer (SiN) or silicon oxynitride layer (SiON).

The first supporting pattern 133a and the second supporting pattern 135a may be provided to have openings 144. For example, the openings 144 may be regions that are provided between the lower electrodes 141 and are not provide with the first supporting pattern 133a and the second supporting pattern 135a.

A dielectric 143 may be formed to cover conformally the lower electrodes 141. The dielectric 143 may be provided to cover conformally not only the lower electrodes 141 but also the etch stop layer 131 and the lower and second supporting patterns 133a and 135a. The dielectric 143 may be formed of at least one selected from the group consisting of, for example, metal oxides (such as $HfO_2$, $ZrO_2$, $Al_2O_3$, $La_2O_3$, $Ta_2O_3$, and $TiO_2$) and perovskite dielectrics (such as STO ($SrTiO_3$), BST ((Ba,Sr)$TiO_3$), $BaTiO_3$, PZT, and PLZT). In addition, the dielectric 143 may have a thickness of about 50 Å to about 150 Å.

An upper electrode 145 may be formed to cover the lower electrodes 141 provided with the dielectric 143. In the case where a deposition thickness of the upper electrode 145 is greater than half a width of each opening 144, the upper electrode 145 may fill the openings 144, an empty space between the first supporting pattern 133a and the second supporting pattern 135a, and an empty space between the first supporting pattern 133a and the etch stop layer 131. The upper electrode 145 may include at least one of doped semiconductor materials, metal materials, metal nitrides, or metal silicides.

Figure 3:
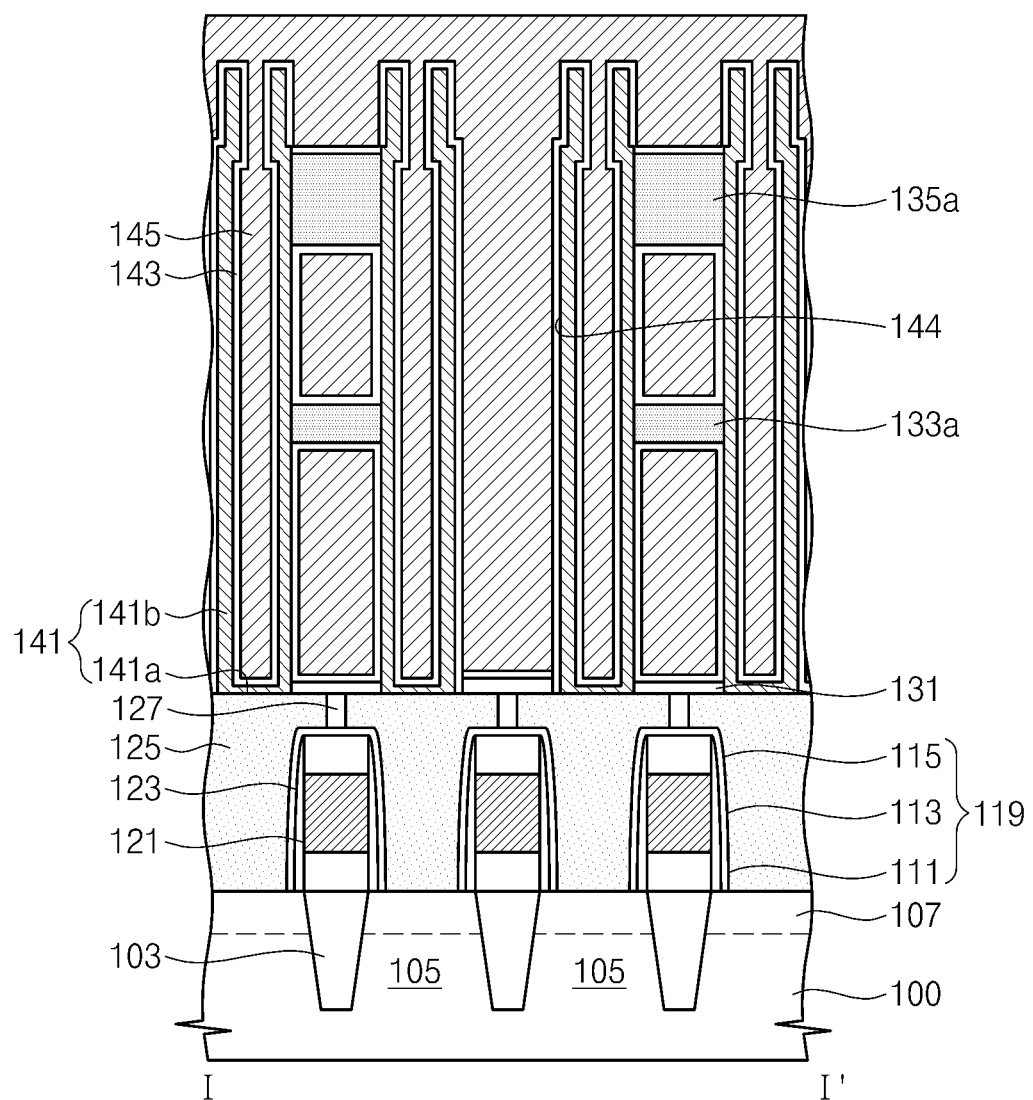
FIG. 3 is a sectional view taken along a line I-I' of FIG. 1 to illustrate a capacitor of a semiconductor device according to other example embodiments of the inventive concepts.

FIG. 3 is a sectional view taken along a line I-I' of FIG. 1 to illustrate a capacitor of a semiconductor device according to other example embodiments of the inventive concepts.

For concise description, in a description of the semiconductor device of FIG. 3, a previously described element may be identified by a similar or identical reference number without repeating an overlapping description thereof.

Referring to FIG. 3, each of the lower electrodes 141 may be shaped like a hollow cylinder with a high aspect ratio. For example, each of the lower electrodes 141 may include a bottom portion 141a and a sidewall portion 141b upward extending from the bottom portion 141a. A diameter of the sidewall portion 141b may be smaller on the upper portion of the lower electrodes 141 than the lower portion of the lower electrodes 141.

The dielectric 143 may be formed on the lower electrodes 141 to cover surfaces of the lower electrodes 141. The dielectric 143 may be formed to cover conformally the structure provided with the lower electrodes 141. The upper electrode 145 may be formed to cover the structure provided with the dielectric 143 and fill an inner space of each lower electrode 141.

Figure 4:
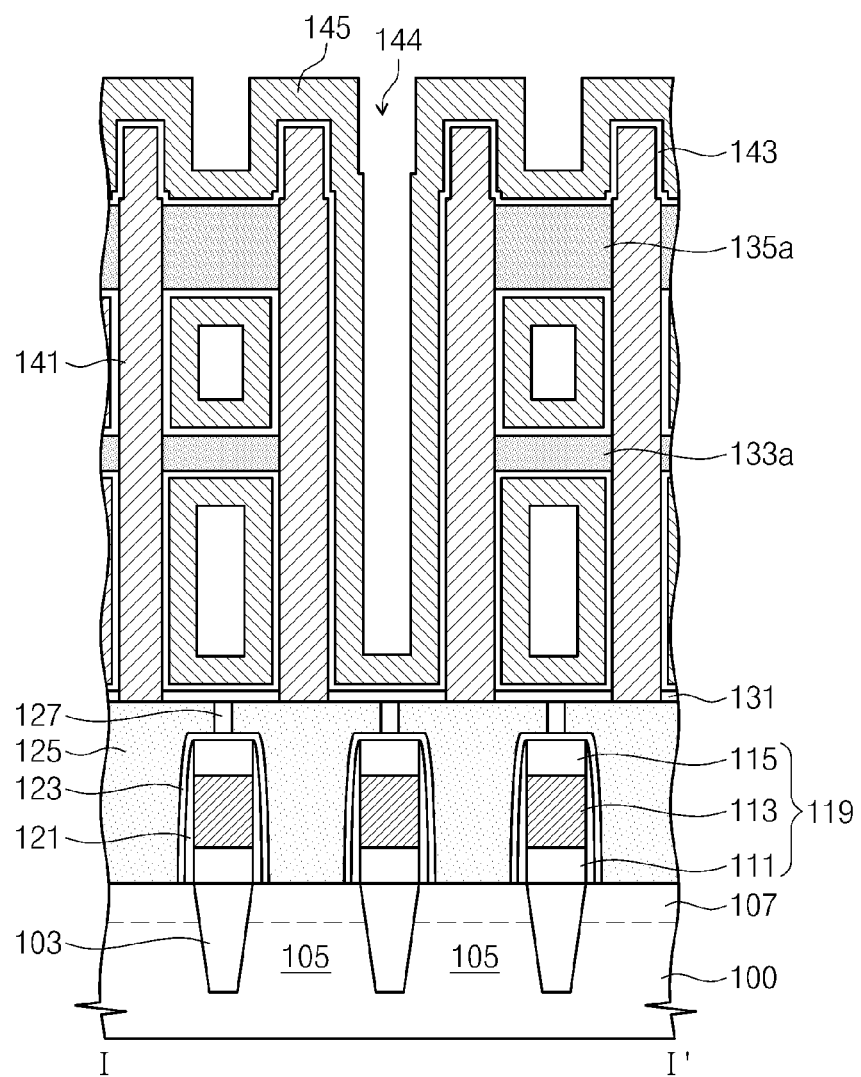
FIG. 4 is a sectional view illustrating a capacitor of a semiconductor device according to still other example embodiments of the inventive concepts.

FIG. 4 is a sectional view illustrating a capacitor of a semiconductor device according to still other example embodiments of the inventive concepts.

For concise description, in a description of the semiconductor device of FIG. 4, a previously described element may be identified by a similar or identical reference number without repeating an overlapping description thereof.

Referring to FIG. 4, the lower electrodes 141 may be shaped like a pillar with a high aspect ratio. The first supporting pattern 133a and the second supporting pattern 135a may be provided on side surfaces of the lower electrodes 141. The first supporting pattern 133a may be provided at a level lower than the second supporting pattern 135a. Each of the lower electrodes 141 may include a lower portion and an upper portion, which are provided below and over the second supporting pattern 135a, respectively. A top surface of the lower electrode 141 may have a width smaller than that of the lower portion of the lower electrode 141. In example embodiments, the upper portion of the lower electrodes 141 may have an upward protruding structure.

The upper electrode 145 may be formed to have a deposition thickness that is smaller than half the width of the opening 144. In this case, the upper electrode 145 may not fill all of the openings 144, the empty space between the first and second supporting patterns 133a and 135a, and the empty space between the first supporting pattern 133a and the etch stop layer 131. For example, the upper electrode 145 may be formed to cover conformally the dielectric 143.

Figure 5:
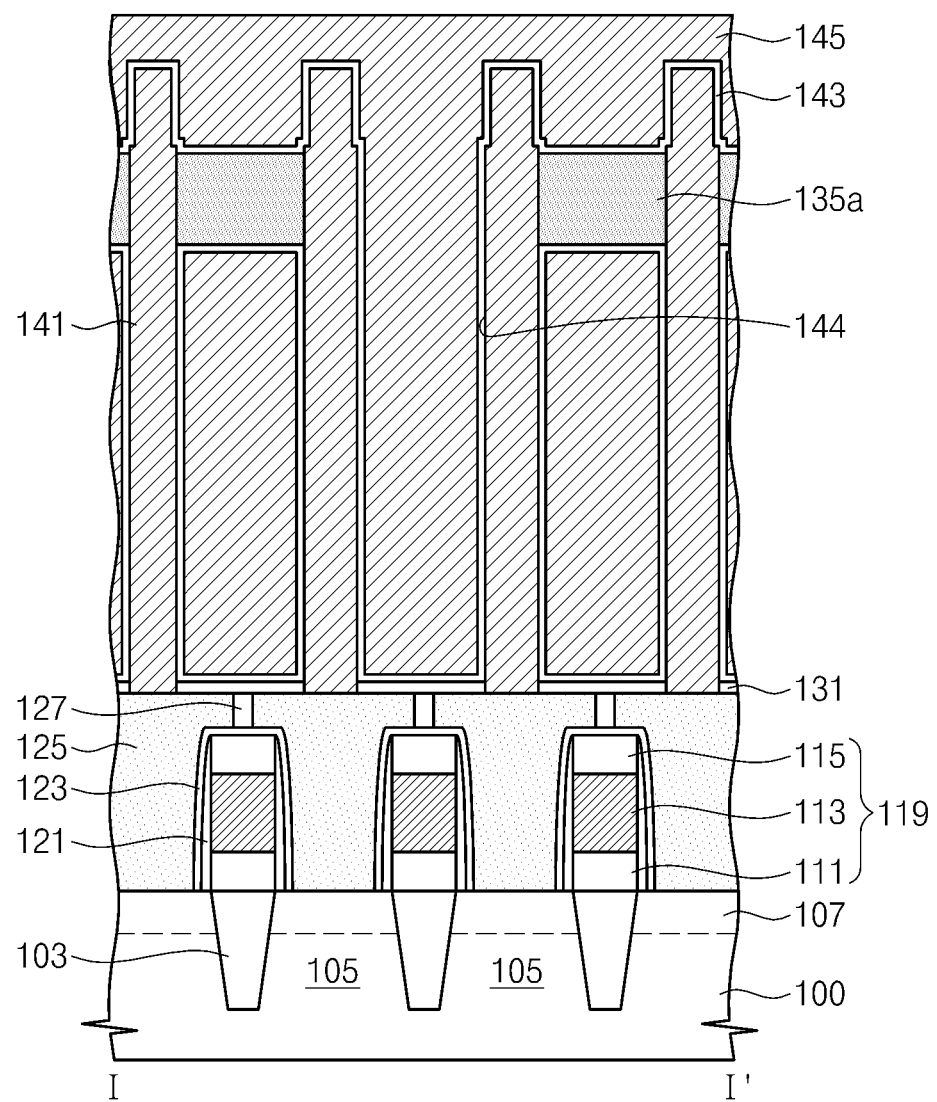
FIG. 5 is a sectional view taken along a line I-I' of FIG. 1 to illustrate a capacitor of a semiconductor device according to still yet other example embodiments of the inventive concepts.

FIG. 5 is a sectional view taken along a line I-I' of FIG. 1 to illustrate a capacitor of a semiconductor device according to still yet other example embodiments of the inventive concepts.

For concise description, in a description of the semiconductor device of FIG. 5, a previously described element may be identified by a similar or identical reference number without repeating an overlapping description thereof.

Referring to FIG. 5, the lower electrodes 141 may be shaped like a pillar with a high aspect ratio. A second supporting pattern 135a may be provided on the sidewall of the lower electrodes 141. Each of the lower electrodes 141 may include a lower portion and an upper portion, which are provided below and over the second supporting pattern 135a, respectively. The top surface of the lower electrode 141 may have a width smaller than that of the lower portion of the lower electrode 141. In example embodiments, the upper portion of the lower electrodes 141 may have an upward protruding structure.

In the case where the upper electrodes 141 have a small aspect ratio, the lower electrodes 141 may be supported by the second supporting pattern 135a. Accordingly, the space between the second supporting pattern 135a and the etch stop layer 131 may be substantially completely filled with the upper electrode 145.

FIGS. 6 through 13 are sectional views illustrating a method of fabricating a capacitor of a semiconductor device according to example embodiments of the inventive concepts.

Figure 6:
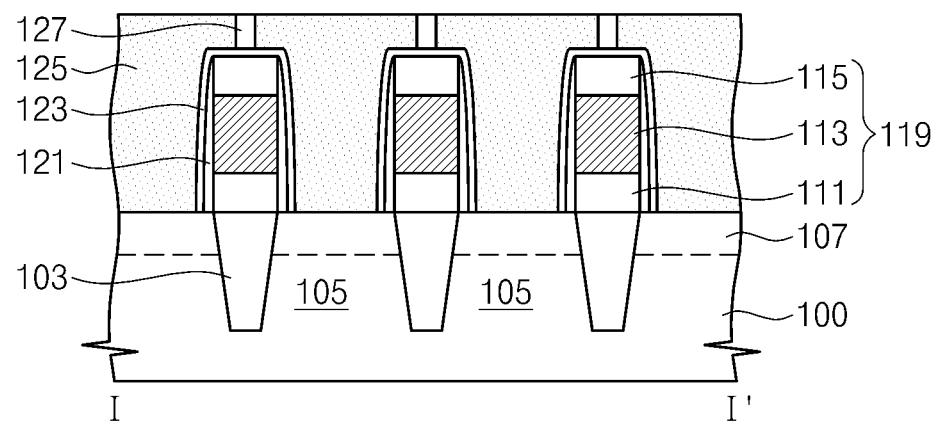
FIGS. 6 through 13 are sectional views illustrating a method of fabricating a capacitor of a semiconductor device according to example embodiments of the inventive concepts.

Referring to FIG. 6, a semiconductor substrate 100 may be provided. The semiconductor substrate 100 may include active regions 105 defined by device isolation layers 103. The semiconductor substrate 100 may be for example, a bulk silicon wafer, a silicon-on-insulator (SOI) wafer, a germanium wafer, a germanium-on-insulator wafer, a silicon-germanium substrate, or a substrate with an epitaxial layer obtained by a selective epitaxial growth (SEG) process.

Word lines 119 may be formed on the semiconductor substrate 100. Each of the word lines 119 may include a gate insulating layer 111, a gate electrode 113, and a gate capping layer 115 sequentially stacked on the semiconductor substrate 100. The word lines 119 may be formed to cross the active regions 105 and the device isolation layers 103.

A plurality of transistors may be formed on the semiconductor substrate 100. Each of the transistors may include a gate electrode and source/drain electrodes 107.

The spacers 121 may be formed on the sidewalls of the word lines 119. The formation of the spacers 121 may include conformally forming an insulating layer (not shown) on the semiconductor substrate 100 provided with the word lines 119, and then, performing an etch-back process on the insulating layer. The spacers 121 may include a silicon nitride layer. The capping layer 123 may be formed to cover conformally the resulting structure including the spacer 121 and the word lines 119.

The bit lines (not shown) may be formed to cross over the word lines 119 provided with the capping layer 123.

The interlayered insulating layer 125 may be formed on the semiconductor substrate 100 to cover the word lines 119, the capping layer 123, and the bit lines (not shown). The interlayered insulating layer 125 may be formed of one or more insulating layers, at least one of which may have a good gap-fill property. For example, the interlayered insulating layer 125 may be formed of boron-phosphor silicate glass (BPSG), High Density Plasma (HDP) oxide, Tetra Ethyl Ortho silicate (TEOS), Undoped Silicate Glass (USG), or Tonen SilaZene (TOSZ). In addition, the interlayered insulating layer 125 may be formed using a chemical vapor deposition process or an atomic layer deposition process. After the formation of the interlayered insulating layer 125, a planarization process may be performed to the top surface of the interlayered insulating layer 125. The planarization process may be performed using a chemical-mechanical polishing process or an etch-back process.

After the planarization process, the contact plugs 127 may be formed through the interlayered insulating layer 125. The contact plugs 127 may be formed in such a way that each of them is electrically connected to the corresponding one of the source/drain electrodes 107. For example, the formation of the contact plugs 127 may include patterning the interlayered insulating layer 125 to form contact holes exposing the source/drain electrodes 107, forming a conductive layer to fill the contact holes, and then, performing a planarization process to the conductive layer. The contact plugs 127 may be formed of at least one of a metal layer, a metal nitride layer, or a metal silicide layer.

Figure 7:
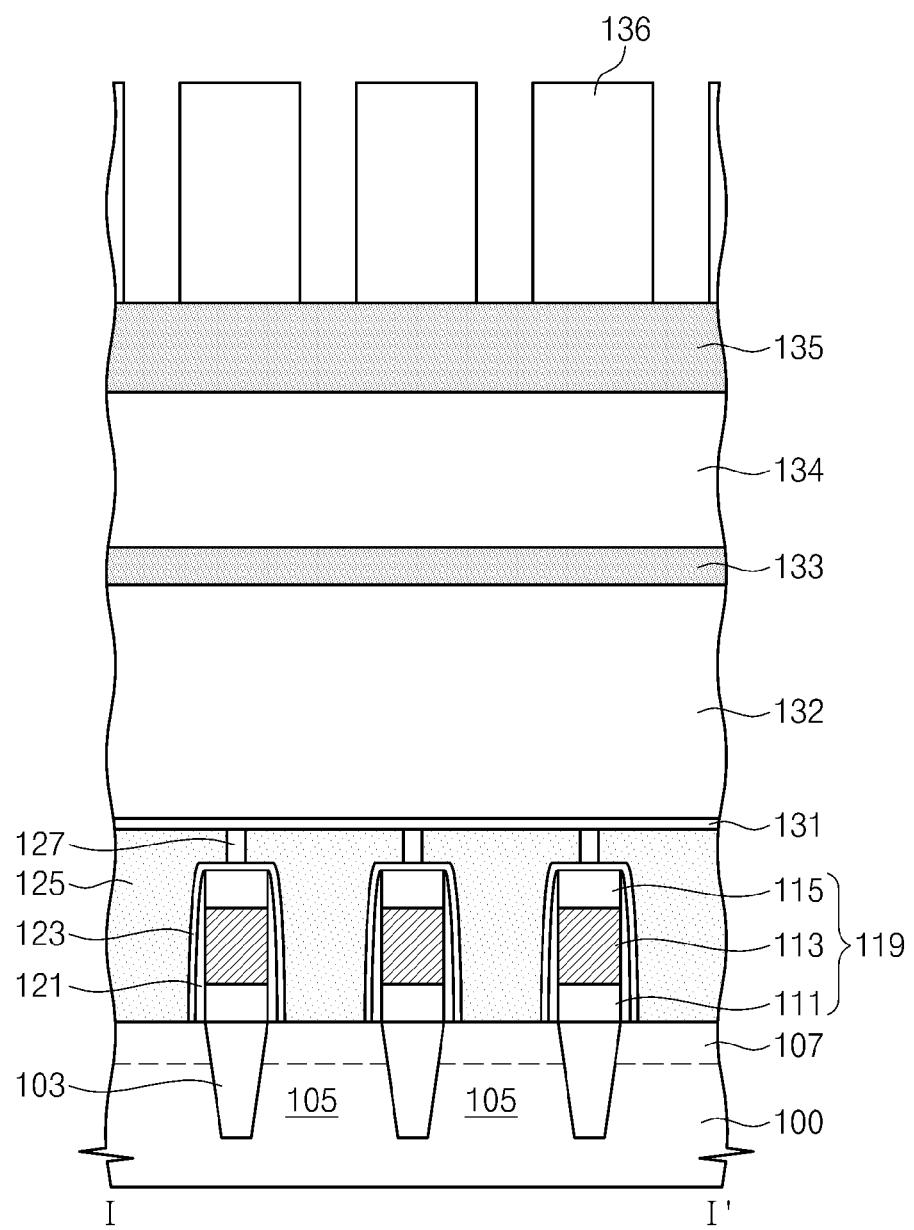

Referring to FIG. 7, a mold structure may be formed on the interlayered insulating layer 125 provided with the contact plugs 127. The mold structure may include the etch stop layer 131, a first mold layer 132, a first supporting layer 133, a second mold layer 134, a second supporting layer 135, and a polysilicon pattern 136, which may be stacked on the interlayered insulating layer 125. The first mold layer 132 and the second mold layer 134 may be formed of a silicon oxide layer or a germanium-containing oxide layer. The first mold layer 132 may be formed to be thicker than the second mold layer 134. The first mold layer 132 and the second mold layer 134 may be formed using a deposition process, such as a chemical vapor deposition (CVD) or a physical vapor deposition (PVD).

The etch stop layer 131 may be formed of a material having an etch selectivity with respect to the interlayered insulating layer 125 and the first mold layer 132. For example, the etch stop layer 131 may be formed of a silicon nitride layer or a silicon oxynitride layer.

The first supporting layer 133 and the second supporting layer 135 may be formed of materials having an etch selectivity with respect to the first mold layer 132 and the second mold layer 134. The first supporting layer 133 and the second supporting layer 135 may be formed of, for example, SiN, SiCN, TaO, or TiO$_2$. The second supporting layer 135 may be formed to be thicker than the first supporting layer 133.

The polysilicon pattern 136 may be a portion of a mask structure provided on the second supporting layer 135. For example, the mask structure may include a polysilicon layer (not shown), an oxide layer (not shown), and an organic mask pattern (not shown), which may be sequentially stacked on the second supporting layer 135. The oxide layer may be etched using the organic mask pattern as an etch mask to form oxide pattern (not shown). The organic mask pattern may be formed of a spin on hardmask (SOH) or amorphous carbon layer (ACL). The oxide layer may be a silicon oxide layer. The polysilicon layer may be etched using the oxide pattern as an etch mask to form the polysilicon pattern 136. The organic mask pattern may be removed during the patterning of the oxide layer, and the oxide pattern may be removed during the pattering of the polysilicon layer.

Figure 8:
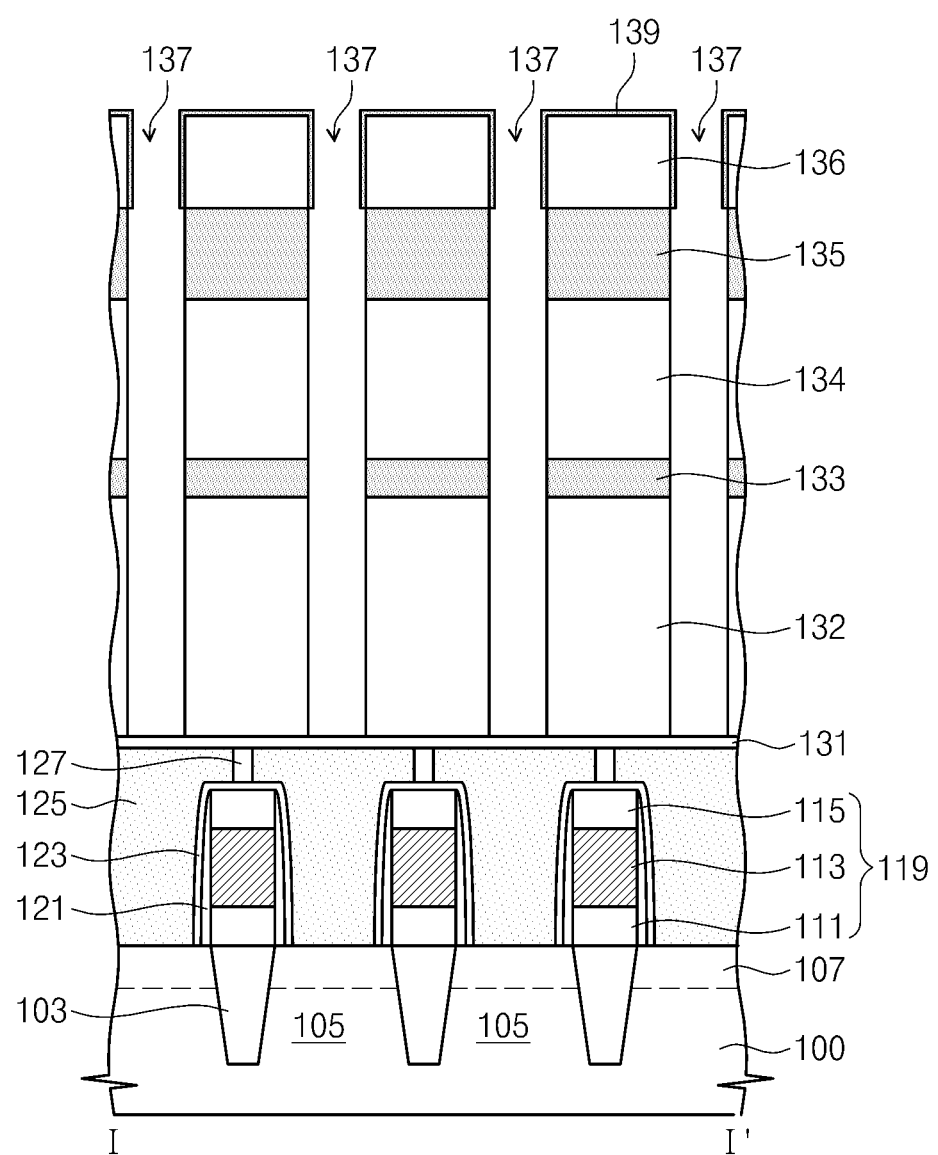

Referring to FIG. 8, the second supporting layer 135, the second mold layer 134, the first supporting layer 133, and the first mold layer 132 may be patterned using the polysilicon pattern 136 as an etch mask to form lower electrode holes 137.

The lower electrode holes 137 may be formed by an anisotropic etching process using an etch recipe that is selected in such a way that a difference in etch rate between the first and second mold layers 132 and 134 and the lower and second supporting layers 133 and 135 is less than 10%. The anisotropic etching process for forming the lower electrode holes 137 may be performed using at least two different etching gases, one of which is used to etch the first and second mold layers 132 and 134 and the other of which is used to etch the supporting layers 133 and 135. During the formation of the lower electrode holes 137, the etch stop layer 131 may be recessed to expose top surfaces of the contact plugs 127.

Furthermore, since the lower electrode holes 137 have the high aspect ratio, the top surface of the polysilicon pattern 136 may be partially etched during the formation of the lower electrode holes 137. However, the formation of the lower electrode holes 137 may be performed to prevent the polysilicon pattern 136 from being completely removed. The polysilicon pattern 136 on the second supporting layer 135 may be used as a mold structure in a subsequent process for forming the lower electrodes 141.

After the formation of the lower electrode holes 137, a cleaning process may be performed to remove impurities, which may be produced in the formation of the lower electrode holes 137.

A protection layer 139 may be formed on the polysilicon pattern 136. The protection layer 139 may be formed to cover conformally a surface of the polysilicon pattern 136. The protection layer 139 may be formed using a plasma process or a deposition process. In the case where the protection layer 139 is formed using the plasma process, the polysilicon pattern 136 may be exposed with nitrogen plasma or oxygen plasma to form the protection layer 139 on the polysilicon pattern 136. In the case where the polysilicon pattern 136 is exposed with the nitrogen plasma, a silicon nitride layer may be formed on the exposed surface of the polysilicon pattern 136. In the case where the polysilicon pattern 136 is exposed with the oxygen plasma, a silicon oxide layer may be formed on the exposed surface of the polysilicon pattern 136.

In the case where the protection layer 139 is formed using the deposition process, an atomic layer deposition (ALD) or chemical vapor deposition (CVD) process may be utilized. The protection layer 139 may be formed to have a thickness of about 10 Å to about 70 Å. The protection layer 139 may be, for example, a silicon nitride layer (SiN) or a silicon oxide layer (SiO$_2$).

In example embodiments, the protection layer 139 may be formed on the sidewalls of the lower electrode holes 137 or on side surfaces of the second supporting layer 135 and the second mold layer 134. Since the lower electrode holes 137 have a high aspect ratio and the polysilicon pattern 136 is formed of a different material from the second supporting layer 135 and the second mold layer 134, the protection layer 139 may not extend from the polysilicon pattern 136 toward the second supporting layer 135 and the second mold layer 134.

The lower electrode holes 137 may become narrow, due to the presence of the protection layer 139.

Figure 9:
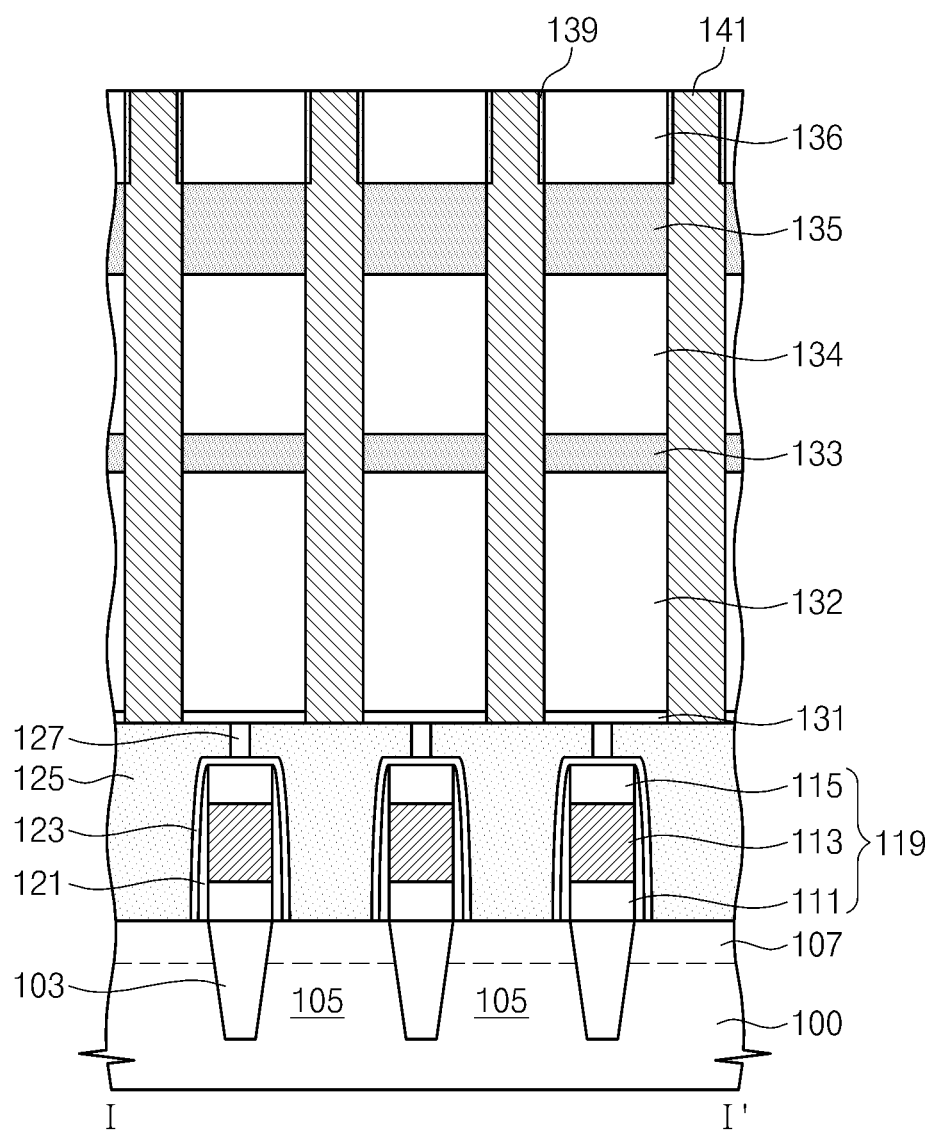

Referring to FIG. 9, a lower electrode layer (not shown) may be formed on the polysilicon pattern 136 provided with the protection layer 139 to fill the lower electrode holes 137. Since the lower electrode holes 137 have a high aspect ratio, the lower electrode layer may be formed using a deposition process having a good step coverage property, such as CVD, ALD, or PVD. The lower electrode layer may include at least one of metal materials, metal nitrides, or metal silicides. For example, the lower electrode layer may be formed of refractory metals, such as cobalt, titanium, nickel, tungsten, and molybdenum. In other example embodiments, the lower electrode layer may be formed of a metal nitride layer (e.g., of titanium nitride (TiN), titanium silicon nitride (TiSiN), titanium aluminum nitride (TiAlN), tantalum aluminum nitride (TaAlN), and tungsten nitride (WN). In still other example embodiments, the lower electrode layer may be formed of at least one noble metal selected from the group consisting of platinum (Pt), ruthenium (Ru) and iridium (Ir). In even other example embodiments, the lower electrode layer may be formed of at least one of conductive oxides of precious metals (e.g., PtO, $RuO_2$, or $IrO_2$) or conductive oxides (e.g., SRO ($SrRuO_3$), BSRO ($(Ba,Sr)RuO_3$), CRO ($CaRuO_3$), or LSCo).

A planarization process may be performed to the lower electrode layer to expose the top surface of the polysilicon pattern 136, thereby forming the lower electrodes 141 in the lower electrode holes 137. The planarization process may be performed to remove the protection layer 139 from the top surface of the polysilicon pattern 136, and thus, the lower electrodes 141 may have top surfaces that are coplanar with that of the polysilicon pattern 136. The planarization process may be performed using a chemical mechanical polishing (CMP) process or an etch-back process.

In other example embodiments, as shown in FIG. 3, the lower electrode layer (not shown) may be formed to cover conformally inner surfaces of the lower electrode holes 137. Accordingly, the lower electrodes 141 may be formed in the lower electrode holes 137 to have a cylindrical structure.

The polysilicon pattern 136 may not be removed after the formation of the lower electrode holes 137 and be used as a mold structure for forming the lower electrodes 141, and this makes it possible to increase a surface area of each lower electrode 141. However, a metal silicide layer may be formed on the polysilicon pattern 136, when silicon atoms in the polysilicon pattern 136 may be reacted with metallic elements in the lower electrodes 141. The metal silicide layer may lead to an increase in electric resistance of the lower electrodes 141 or deterioration in electric characteristics of capacitors. According to example embodiments of the inventive concepts, the protection layer 139 may be formed on the polysilicon pattern 136 to prevent an undesired reaction between the silicon atoms of the polysilicon pattern 136 and the metallic elements of the lower electrodes 141 or an undesired formation of the metal silicide layer. Accordingly, it is possible to form the lower electrodes 141 having an increased surface area and improved electric characteristics.

Figure 10:
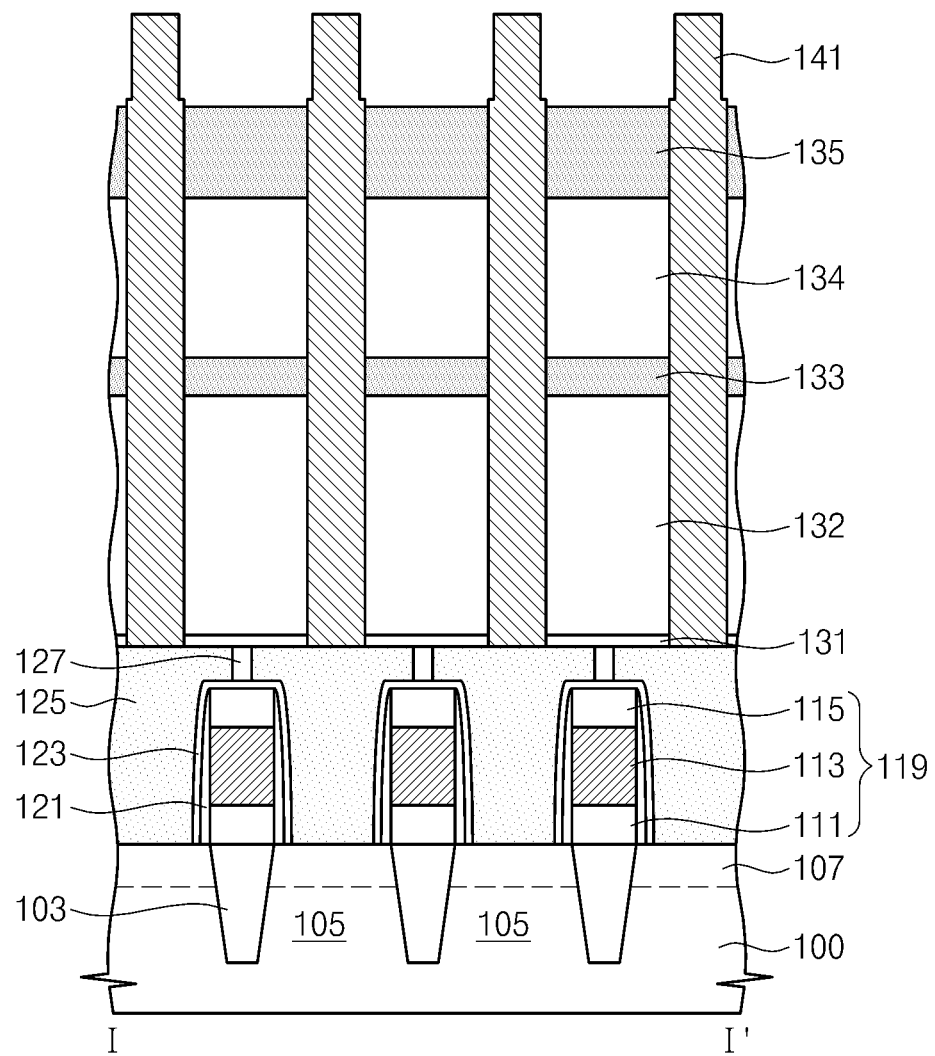

Referring to FIG. 10, the polysilicon pattern 136 may be removed.

The removal of the polysilicon pattern 136 may be performed to remove the protection layer 139. In other words, the upper portion of the lower electrodes 141 may have a reduced width, compared with the lower portion thereof. The removal of the polysilicon pattern 136 may be performed using a dry etching process. For example, the polysilicon pattern 136 may be removed by a dry etching process using fluorine-based etching gas, such as $CF_4$, $CF_4/O_2$, $SF_6$, $C_2F_6/O_2$ or $NF_3$.

During the removal of the polysilicon pattern 136, the top surface of the second supporting layer 135 may be partially recessed. Thus, the thickness of the second supporting layer 135 may be reduced.

Figure 11:
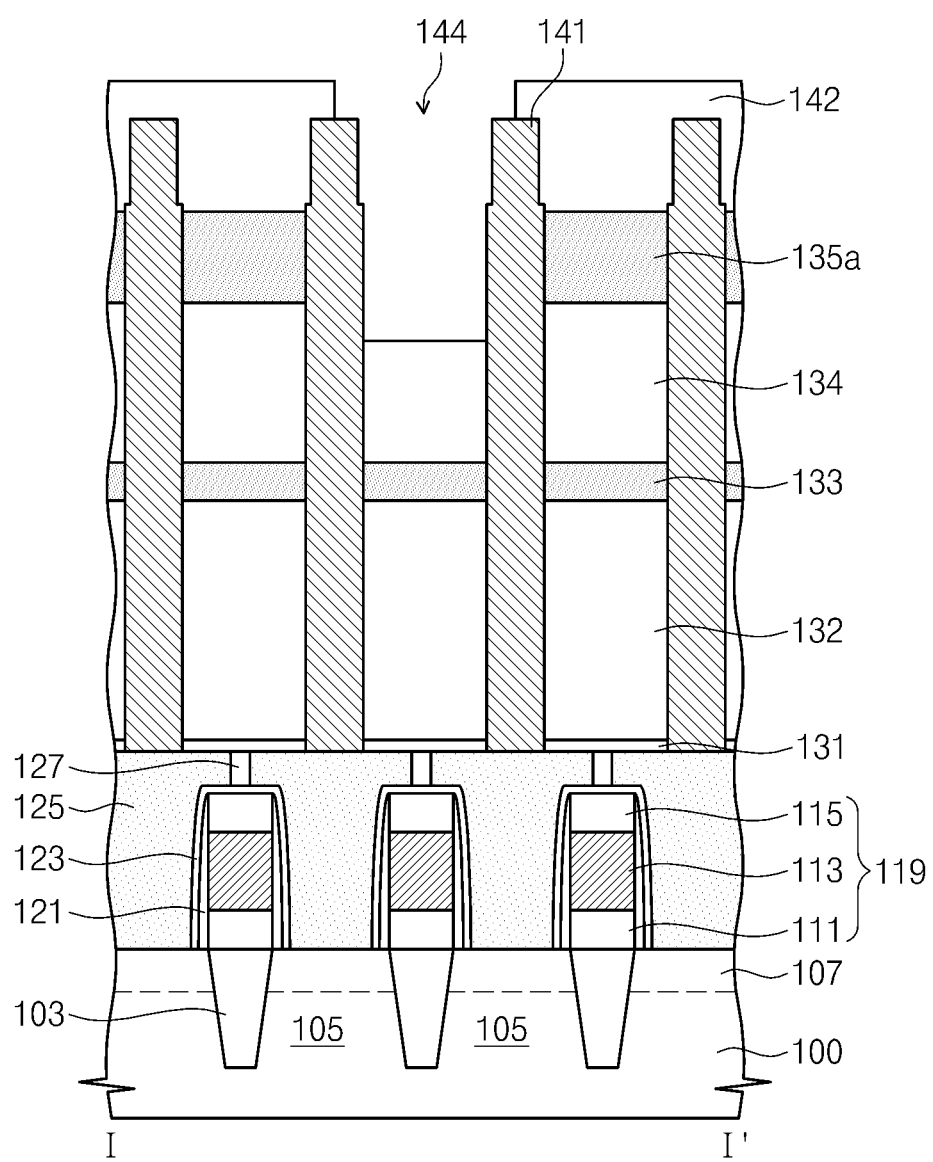

Referring to FIG. 11, a mask pattern 142 may be formed on the second supporting layer 135, and the second supporting layer 135 may be etched to form the opening 144.

For example, the formation of the opening 144 may include anisotropically etching a portion of the second supporting layer 135 exposed by the mask pattern 142 using the mask pattern 142 as an etch mask. As a result, the second supporting layer 135 may be patterned to form the second supporting pattern 135*a* laterally supporting the lower electrodes 141. The upper portion of the second mold layer 134 adjacent to each other in the second supporting layer 135 may be partially removed as a result of an over-etch, which may occur when the second supporting layer 135 is partially removed. The mask pattern 142 may be removed after the formation of the opening 144.

Figure 12:
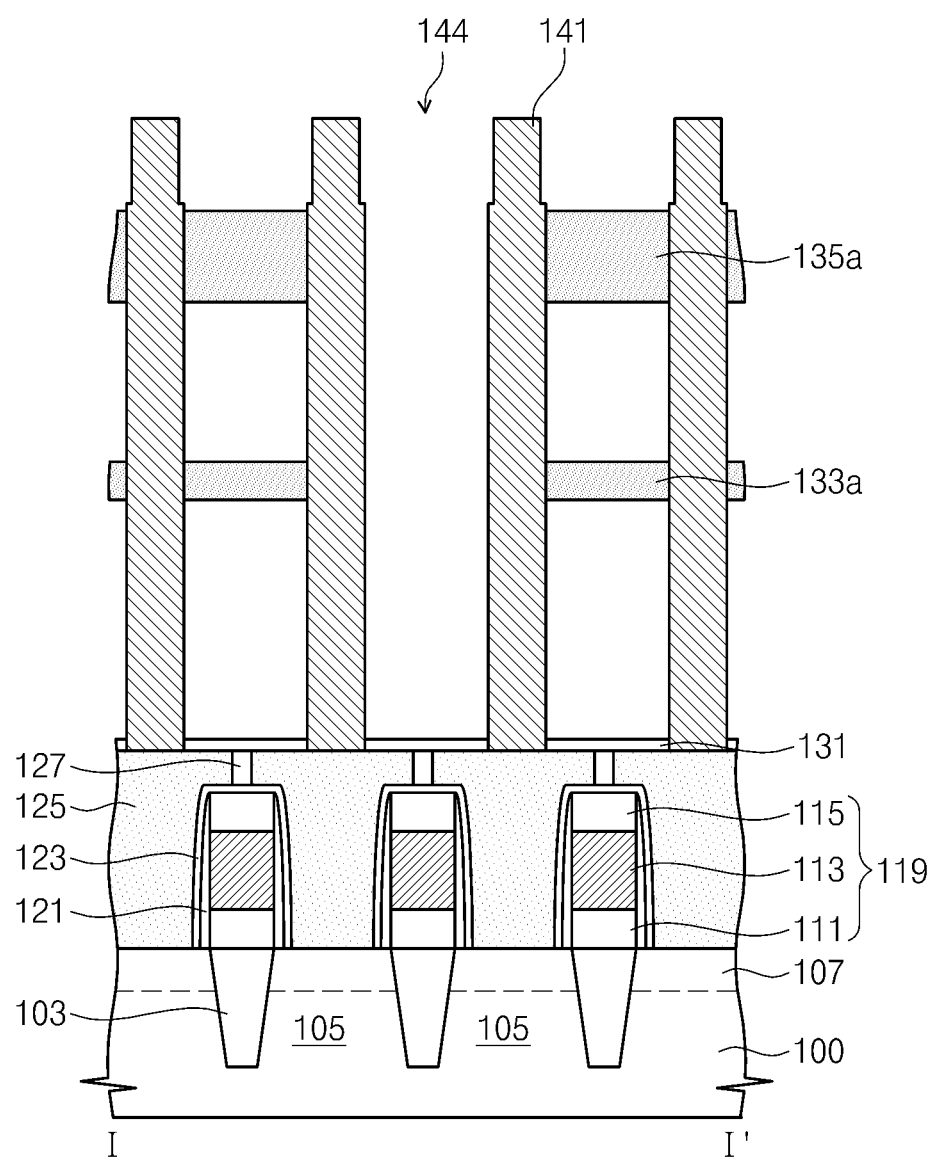

Referring to FIG. 12, the second mold layer 134, the first supporting layer 133, and the first mold layer 132 exposed by the mask pattern 142 may be sequentially removed through the opening 144.

For example, the second mold layer 134 may be completely removed using an etch recipe having an etch selectivity with respect to the second supporting pattern 135*a* and first supporting layer 133. The second mold layer 134 may be removed by an etching solution to be supplied through the opening 144. In the case where the second mold layer 134 is formed of a silicon oxide layer, the second mold layer 134 may be removed by a wet etching process using an etching solution containing hydrofluoric acid. In other example embodiments, in the case where the second mold layer 134 is formed of a silicon nitride layer, the second mold layer 134 may be removed by a wet etching process using an etching solution containing phosphoric acid.

The first supporting layer 133 exposed by the opening 144 may be partially etched, after the removal of the second mold layer 134. Accordingly, the first supporting layer 133 may be patterned to form the first supporting pattern 133*a* supporting the lower electrodes 141. The upper portion of the first mold layer 132 adjacent to each other in the first supporting layer 133 may be partially removed as a result of an over-etch, which may occur when the first supporting layer 133 is partially removed.

The first mold layer 132 may be completely removed using an etch recipe having an etch selectivity with respect to the first supporting pattern 133*a* and the second supporting pattern 135*a*. Since the first mold layer 132 may be formed of the same material as the second mold layer 134, the first mold layer 132 may be removed using substantially the same method as that for removing the second mold layer 134.

The first mold layer 132 and the second mold layer 134 may be removed to expose partially the sidewalls of the lower electrodes 141 and the top surface of the etch stop layer 131.

Figure 13:
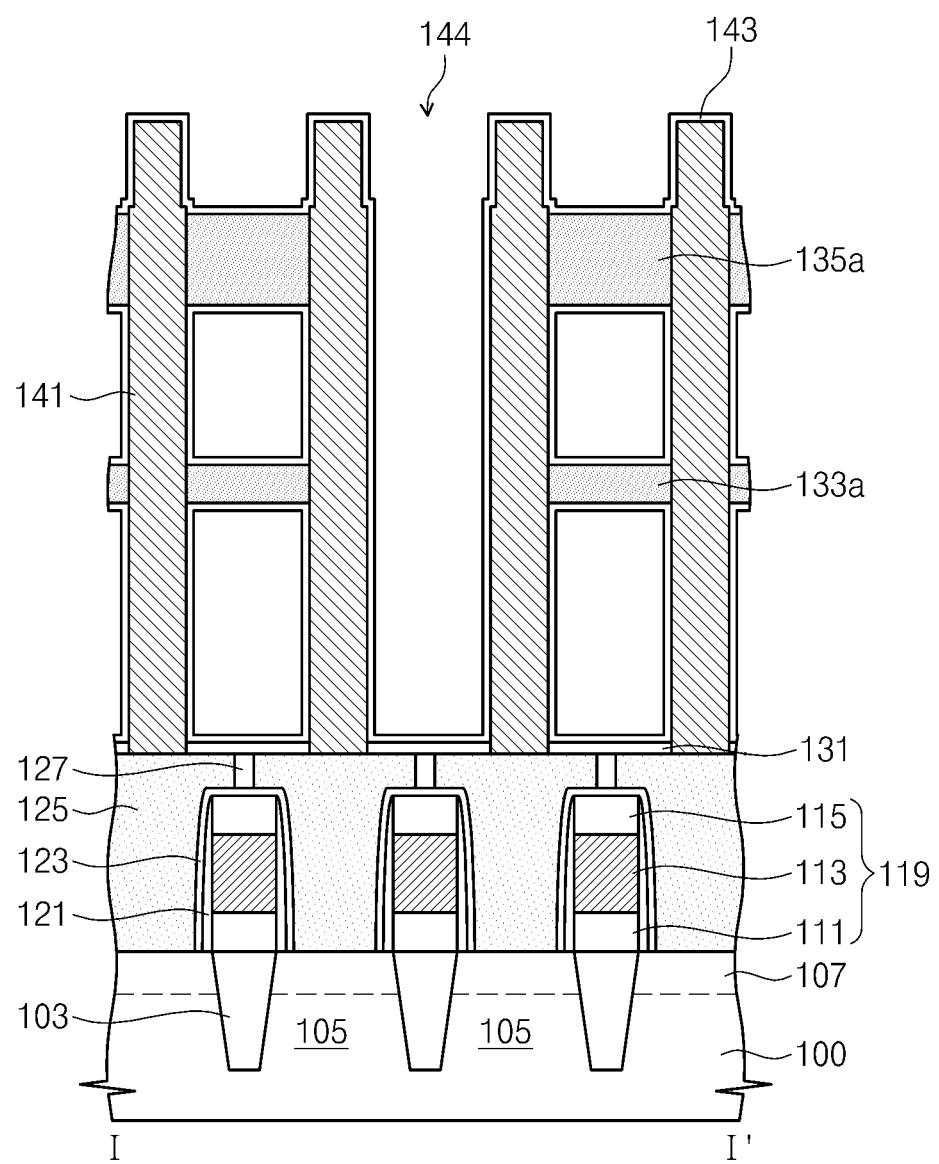

Referring to FIG. 13, the dielectric 143 may be formed to cover conformally the resulting structure including the lower electrodes 141 and the lower and upper supporting patterns 133a 135a. The dielectric 143 may be formed using a deposition process having a good step coverage property, such as CVD, ALD, or PVD.

The dielectric 143 may be formed of at least one selected from the group consisting of, for example, metal oxides (such as $HfO_2$, $ZrO_2$, $Al_2O_3$, $La_2O_3$, $Ta_2O_3$, and $TiO_2$) and perovskite dielectrics (such as STO ($SrTiO_3$), BST (($Ba,Sr)TiO_3$), $BaTiO_3$, PZT, and PLZT). In addition, the dielectric 143 may be formed to have a thickness of about 50 Å to about 150 Å.

Referring back to FIG. 2, an upper electrode 145 may be formed on the dielectric 143 to cover the lower electrodes 141 and fill the opening 144. The upper electrode 145 may be formed using a deposition process (e.g., CVD, ALD, or PVD). In the case where a deposition thickness of the upper electrode 145 is greater than half a width of each opening 144, the upper electrode 145 may be formed to fill the openings 144. In addition, the upper electrode 145 may be formed to fill completely empty spaces between the first and second supporting patterns 133a and 135a and between the first supporting pattern 133a and the etch stop layer 131, which may be formed by the removal of the first and second mold patterns 132a and 134a.

In still other example embodiments, as shown in FIG. 4, in the case where the deposition thickness of the upper electrode 145 is smaller than half a width of each opening 144, the upper electrode 145 may be formed not to fill the whole region of the opening 144. For example, the upper electrode 145 may be formed to cover conformally the inner surface of the opening 144. In addition, the upper electrode 145 may be formed to fill partially the empty spaces between the first and second supporting patterns 133a and 135a and between the first supporting pattern 133a and the etch stop layer 131, which may be formed by the removal of the first and second mold patterns 132a and 134a. For example, the upper electrode 145 may be formed to cover conformally the dielectric 143.

The upper electrode 145 may include at least one of doped semiconductor materials, metal materials, metal nitrides, or metal silicides. In other example embodiments, the upper electrode 145 may be formed of refractory metals, such as cobalt, titanium, nickel, tungsten, and molybdenum. In still other example embodiments, the upper electrode 145 may be formed of a metal nitride layer (e.g., of titanium nitride (TiN), titanium aluminum nitride (TiAlN), and tungsten nitride (WN)). In even other example embodiments, the upper electrode 145 may be formed of at least one noble metal selected from the group consisting of platinum (Pt), ruthenium (Ru) and iridium (Ir).

Figure 14:
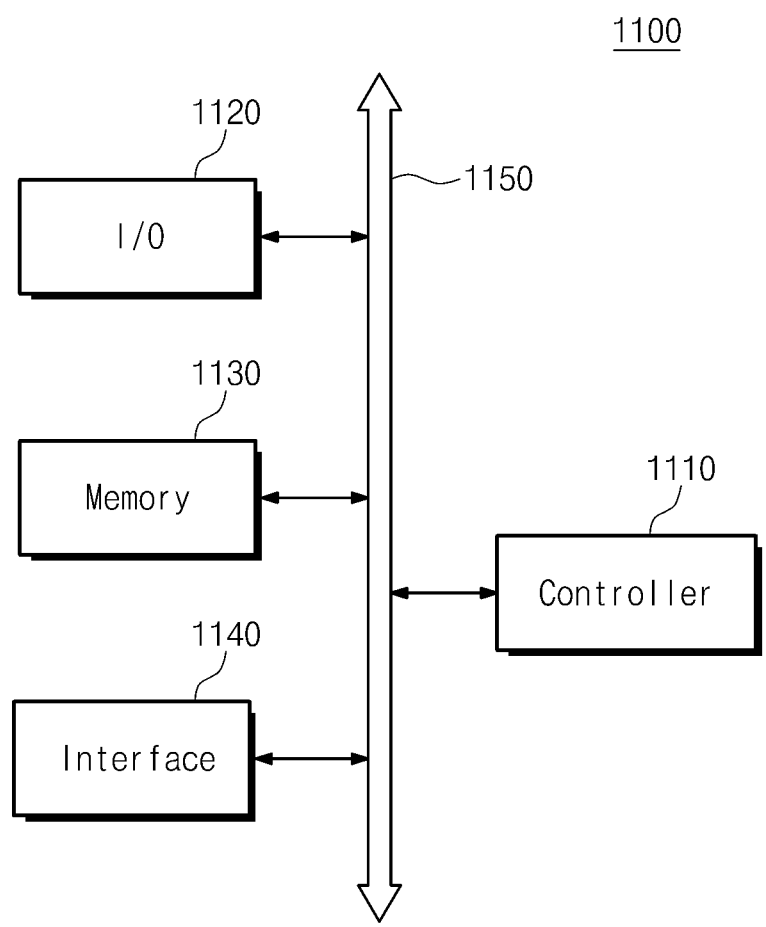
FIG. 14 is a schematic block diagram illustrating an example of electronic systems including a semiconductor device according to example embodiments of the inventive concepts.

FIG. 14 is a schematic block diagram illustrating an example of electronic systems including a semiconductor device according to example embodiments of the inventive concepts.

Referring to FIG. 14, an electronic system 1100 according to example embodiments of the inventive concepts may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The controller 1110, the input-output unit 1120, the memory device 1130, and/or the interface 1140 may be configured to include one of semiconductor devices according to example embodiments of the inventive concepts.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may be configured to receive or transmit information data wirelessly.

Figure 15:
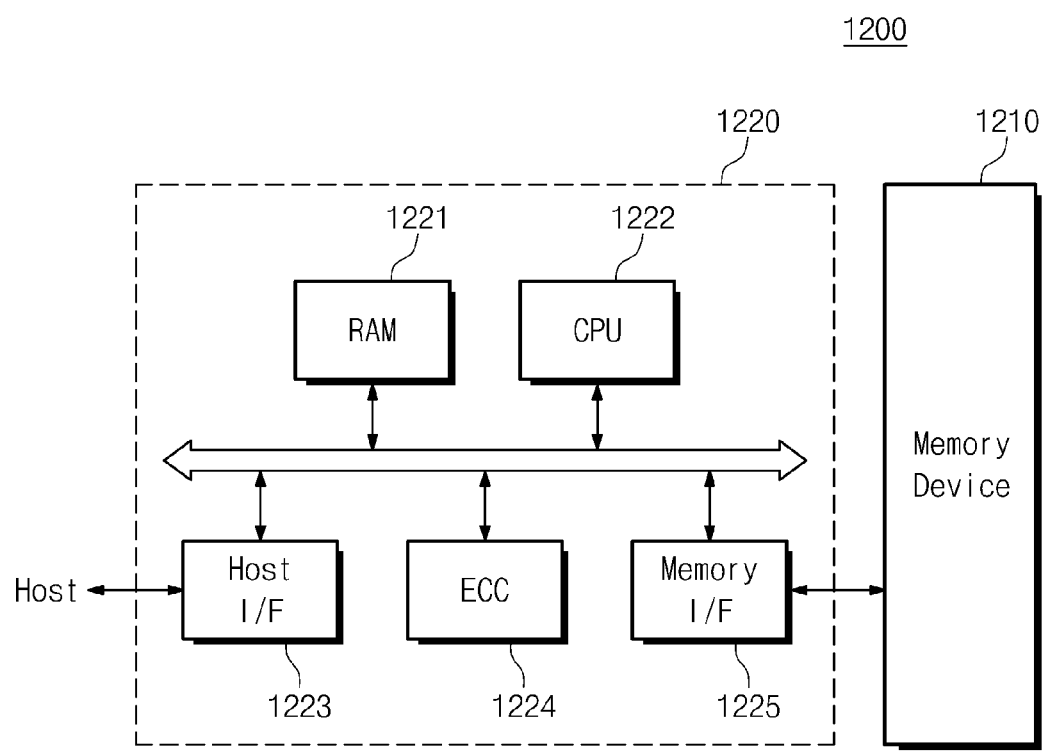
FIG. 15 is a schematic block diagram illustrating an example of memory cards including a semiconductor memory device according to example embodiments of the inventive concepts.

FIG. 15 is a schematic block diagram illustrating an example of memory cards including a semiconductor memory device according to example embodiments of the inventive concepts.

Referring to FIG. 15, a memory card 1200 according to example embodiments of the inventive concepts may include a memory device 1210. The memory device 1210 may include at least one of the semiconductor memory devices according to the afore-described example embodiments of the inventive concepts. In other example embodiments, the memory device 1210 may further include a semiconductor memory device, which is of a different type from the semiconductor memory devices according to the afore-described example embodiments of the inventive concepts. For example, the memory device 1210 may further include a nonvolatile memory device and/or a static random access memory (SRAM) device. The memory card 1200 may include a memory controller 1220 that controls data communication between a host and the memory device 1210. The memory controller 1220 may be configured to include at least one of the semiconductor devices according to example embodiments of the inventive concepts.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data, which are read out from the memory device 1210. The memory card 1200 may further include a read only memory (ROM) device that stores code data to interface with the host. The memory card 1200 may be used as a portable data storage card. Alternatively, the memory card 1200 may be provided in the form of solid state disks (SSD), instead of hard disks of computer systems.

According to example embodiments of the inventive concepts, in a capacitor of a semiconductor device, a process of forming a lower electrode may include forming a polysilicon pattern on a mold structure and forming lower electrode holes using the polysilicon pattern as an etch mask to penetrate the mold structures. The polysilicon pattern may not be removed and be used a portion of a mold structure for forming the lower electrode. This makes it possible to increase an effective area of the lower electrode.

A protection layer may be formed on a surface of the polysilicon pattern serving as a portion of the mold structure. Due to the presence of the protection layer, it is possible to prevent silicon atoms in the polysilicon pattern from being reacted with metallic elements in the lower electrodes. In other words, it is possible to prevent a metal silicide layer from being formed on the surface of the polysilicon pattern, when the lower electrodes are formed in the lower electrode holes. This makes it possible to prevent electric characteristics of the capacitor from being deteriorated by the metal silicide material remaining on the lower electrode.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a capacitor of a semiconductor device, comprising: sequentially forming a mold structure and a polysilicon pattern over a semiconductor substrate;
   patterning the mold structure using the polysilicon pattern as an etch mask to form lower electrode holes penetrating the mold structure;
   forming a protection layer covering a surface of the polysilicon pattern;
   forming lower electrodes in the lower electrode holes provided with the protection layer;
   removing the polysilicon pattern and the protection layer to expose upper sidewalls of the lower electrodes;
   removing the mold structure to expose lower sidewalls of the lower electrodes; and
   sequentially forming a dielectric and an upper electrode covering the lower electrodes.

2. The method of claim 1, wherein the forming a protection layer includes performing a deposition process.

3. The method of claim 1, wherein the forming a protection layer comprises treating a surface of the polysilicon pattern with plasma generated from an oxygen gas or a nitrogen gas.

4. The method of claim 1, wherein the forming a protection layer includes forming a silicon oxide layer or a silicon nitride layer.

5. The method of claim 1, wherein the removing the polysilicon pattern and the protection layer includes partially removing an upper portion of the mold structure so as to reduce a thickness of the mold structure.

6. The method of claim 1, wherein the forming a mold structure comprises sequentially stacking a first mold layer, a first supporting layer, a second mold layer, and a second supporting layer on the semiconductor substrate.

7. The method of claim 6, wherein the removing the mold structure comprises:
   patterning the second supporting layer to form an opening exposing an upper portion of the second mold layer;
   removing the second mold layer exposed through the opening so as to expose a portion of the first supporting layer;
   patterning the exposed portion of the first supporting layer to expose the first mold layer; and
   removing the first mold layer.

8. The method of claim 7, wherein,
   the patterning of the exposed portion of the first supporting layer and the second supporting layer comprises forming first and second supporting patterns, respectively, and
   the first and second supporting patterns each partially contact side surfaces of the lower electrodes.

9. The method of claim 7, wherein the forming a mold structure includes forming the first and second supporting layers of materials having an etch selectivity with respect to materials used to form the first and second mold layers in the removal of the first and second mold layers.

10. The method of claim 1, wherein the forming lower electrodes comprises depositing a conductive layer conformally covering inner surfaces of the lower electrode holes.

11. A method of fabricating a capacitor, comprising:
    providing mold structure patterns over a semiconductor substrate, the mold structure patterns being spaced apart from each other, and the providing including,
    forming mold patterns on the substrate, the mold pattern having a polysilicon pattern over an uppermost layer, and
    forming a polysilicon mask shield covering the polysilicon pattern;
    forming lower electrodes each between adjacent mold structure patterns, the lower electrodes each contacting sidewalls of the polysilicon mask shield;
    exposing sidewalls of the lower electrodes by partially removing the mold structure patterns; and
    sequentially forming a dielectric and an upper electrode covering the lower electrodes.

12. The method of claim 11, wherein the exposing sidewalls of the lower electrodes includes sequentially,
    exposing an upper portion of the sidewalls of the lower electrodes by removing the polysilicon mask shield and the polysilicon pattern using a thy etchant; and
    exposing a lower portion of the sidewalls of the lower electrodes by partially removing the mold patterns using a wet etchant.

13. The method of claim 11, wherein,
    the forming mold patterns comprises,
    sequentially forming an etch stop layer, a first mold layer, a first supporting layer, a second mold layer, a second supporting layer, and the polysilicon pattern over the semiconductor substrate, and
    patterning the second supporting layer, the second mold layer, the first supporting layer and the first mold layer to form a second supporting pattern, a second mold pattern, a first supporting pattern and a first mold pattern, respectively, and
    the first and second supporting patterns remain in contact with the sidewalls of the lower electrodes, after partially removing the mold structure patterns.

14. The method of claim 13, wherein,
    the sequentially forming a dielectric and an upper electrode covering the lower electrodes includes forming the upper electrode covering the sidewalls of the lower electrodes between the first and second supporting patterns, and
    the upper electrode between the first and second supporting patterns is hollow.

15. The method of claim 11, wherein the forming a polysilicon mask shield includes conformally forming a nitride layer or an oxide layer covering exposed surfaces of the polysilicon pattern by performing a plasma process or a deposition process.

16. The method of claim 11, wherein the forming a polysilicon mask shield covering the polysilicon pattern includes forming the polysilicon mask shield having sidewalls extending beyond sidewalls of the polysilicon pattern so as to reduce a space between the polysilicon pattern over the adjacent mold patterns.

\* \* \* \* \*